(12) United States Patent
Yamashita

(10) Patent No.: US 6,310,501 B1
(45) Date of Patent: Oct. 30, 2001

(54) LATCH CIRCUIT FOR LATCHING DATA AT AN EDGE OF A CLOCK SIGNAL

(75) Inventor: Kazuo Yamashita, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/449,234

(22) Filed: Nov. 24, 1999

(30) Foreign Application Priority Data

Nov. 27, 1998 (JP) .................................................. 10-336714

(51) Int. Cl.[7] .................................................... H03K 3/12
(52) U.S. Cl. .............................. 327/215; 327/55; 327/211
(58) Field of Search ........................... 327/208, 210–212, 327/215, 219, 55

(56) References Cited

U.S. PATENT DOCUMENTS

| | | | |
|---|---|---|---|
| 5,155,397 | * 10/1992 | Fassino et al. | 327/55 |
| 5,748,020 | * 5/1998 | Mactaggart et al. | 327/55 |
| 5,977,798 | * 11/1999 | Zerbe | 327/55 |
| 6,107,853 | * 8/2000 | Nikolic et al. | 327/211 |

* cited by examiner

*Primary Examiner*—Kenneth B. Wells
(74) *Attorney, Agent, or Firm*—Scully, Scott, Murphy & Presser

(57) ABSTRACT

A latch circuit comprises a delaying inverter circuit 1 for inverting a clock signal CLK with a predetermined delay, a precharge circuit for precharging a first node A and a second node B of the latch circuit to a predetermined potential during a time period in which the clock signal is in a first logic level, a first amplifier circuit for providing a potential difference between the first node A and the second node B in response to an input signal DIN during a first time period in which the clock signal CLK and an output signal iCLK of the delaying inverter circuit are in a second logic level, a second amplifier circuit for amplifying the potential difference between the first node and the second node during a time period in which the clock signal is in the second logic level and a flip-flop circuit adapted to be set and reset according to the potentials at the first and second nodes.

2 Claims, 3 Drawing Sheets

LATCH CIRCUIT FOR LATCHING DATA AT AN EDGE OF A CLOCK SIGNAL

BACKGROUND OF THE INVENTION

1. Field of the Invention

The present invention relates to a latch circuit and, particularly, to a latch circuit for latching data at an edge of a clock signal.

2. Description of the Related Art

A latch circuit for latching input data at an edge of a control signal such as clock signal has been used popularly as a logic circuit in an integrated circuit or a semiconductor device. For example, FIG. 3 is a block circuit diagram showing a construction of a conventional latch circuit.

The conventional latch circuit comprises an inverter 51 for inverting a clock signal CLK and outputting an inverted clock signal iCLK, a master portion 52 and a slave portion 53. The master portion 52 and the slave portion 53 are connected in series between an input terminal and an output terminal for controlling a signal transmission between the input terminal and the output terminal correspondingly to the clock signal CLK and the inverted clock signal iCLK, respectively.

The master portion 52 is controlled by the clock signal CLK and the inverted clock signal iCLK. The master portion 52 includes an input transfer gate 521 controlled by the inverted clock signal iCLK for transferring an input signal, two-stage inverters 522 and 523 for amplifying the input signal thus transferred and a feedback transfer gate 524 controlled by the clock signal CLK for feeding an output of the inverter 523 back to an input thereof. The slave portion 53 has the same construction as that of the master portion 52 and includes an input transfer gate 531 controlled by the clock signal CLK for transferring an input signal, two-stage inverters 532 and 533 for amplifying the input signal thus transferred and a feedback transfer gate 534 controlled by the inverted clock signal iCLK for feeding an output of the inverter 533 back to an input thereof.

An operation of this conventional latch circuit will be described briefly. The master portion 52 takes in an input signal DIN in response to a low level of the clock signal CLK and outputs a signal held in the slave portion 53 as a latch output signal Q.

Then, when the clock signal CLK is changed to a high level, the input signal taken in by the master portion 52 is held therein and, simultaneously, the input signal is taken in by the slave portion 53 and outputted thereby as the latch output signal Q.

Therefore, the latch circuit latches the input signal DIN and outputs it as the output signal Q in synchronism with the change of the level of the clock signal CLK from low to high.

In order to guarantee the operation of the latch circuit, a setup time or a hold time is set as a speck value defining the timing of change of the input signal DIN. The setup time is a minimum time required for latching the input signal DIN before the change of the clock signal CLK and the hold time is a minimum time required for latching the input signal DIN after the change of the clock signal CLK.

In a case where a plurality of latch circuits are used, the timing of the change of clock signal and input signal in each latch circuit depends upon external conditions. Therefore, the setup time and the hold time set for each latch circuit by the clock signal as a reference varies and the setup time and the hold time of the whole latch circuits becomes the worst one of the speck values of the latch circuits.

The setup time or the hold time of an SDRAM or DDR-SDRAM which uses the conventional latch circuits is severely determined compared with that of a conventional DRAM, since the SDRAM or the DDR-SDRAM is operated at high speed. However, it becomes difficult to satisfy the setup time or the hold time required for the conventional latch circuit correspondingly to such high speed operation.

Describing the reason for this by taking the setup time, as an example, which is the minimum time for latching the input signal DIN changed in level before the level of the clock signal CLK is changed, the minimum time corresponds to a minimum propagation time from a time when the changed input signal DIN is propagated to the feedback transfer gate 524 of the master portion 52 to a time at which the input signal is determined as a hold data by a turning on of the feedback transfer gate 524 corresponding to the level change of the clock signal CLK. However, delay time of a latch circuit varies depending upon the kind of latch circuit, causing the design of the latch circuit to become difficult. This is also true for the hold time.

BRIEF SUMMARY OF THE INVENTION

OBJECTS OF THE INVENTION

An object of the present invention is to facilitate a timing design of an integrated circuit having a minimized absolute value of the setup time or the hold time based on a clock signal as a reference.

SUMMARY OF THE INVENTION

A latch circuit according to the present invention comprises a delay inverter circuit for inverting and outputting a clock signal after a predetermined delay time lapses, a precharge circuit for precharging first and second nodes of the latch circuit to a predetermined potential during a time period in which the clock signal is at a first logic level, a first amplifier circuit for providing a potential difference between the first and second nodes in response to an input signal during a time period in which the clock signal and the output signal of the delay inverter circuit are at a second logic level, a second amplifier circuit for amplifying the potential difference between the first and second nodes during a time period in which the clock signal is at the second logic level and a flip-flop circuit set and reset according to the potentials at the first and second nodes.

BRIEF DESCRIPTION OF THE DRAWINGS

The above mentioned and other objects, features and advantages of the present invention will become more apparent by reference to the following detailed description of the invention taken in conjunction with the accompanying drawings, in which.

DETAILED DESCRIPTION OF THE INVENTION

Figure 1:
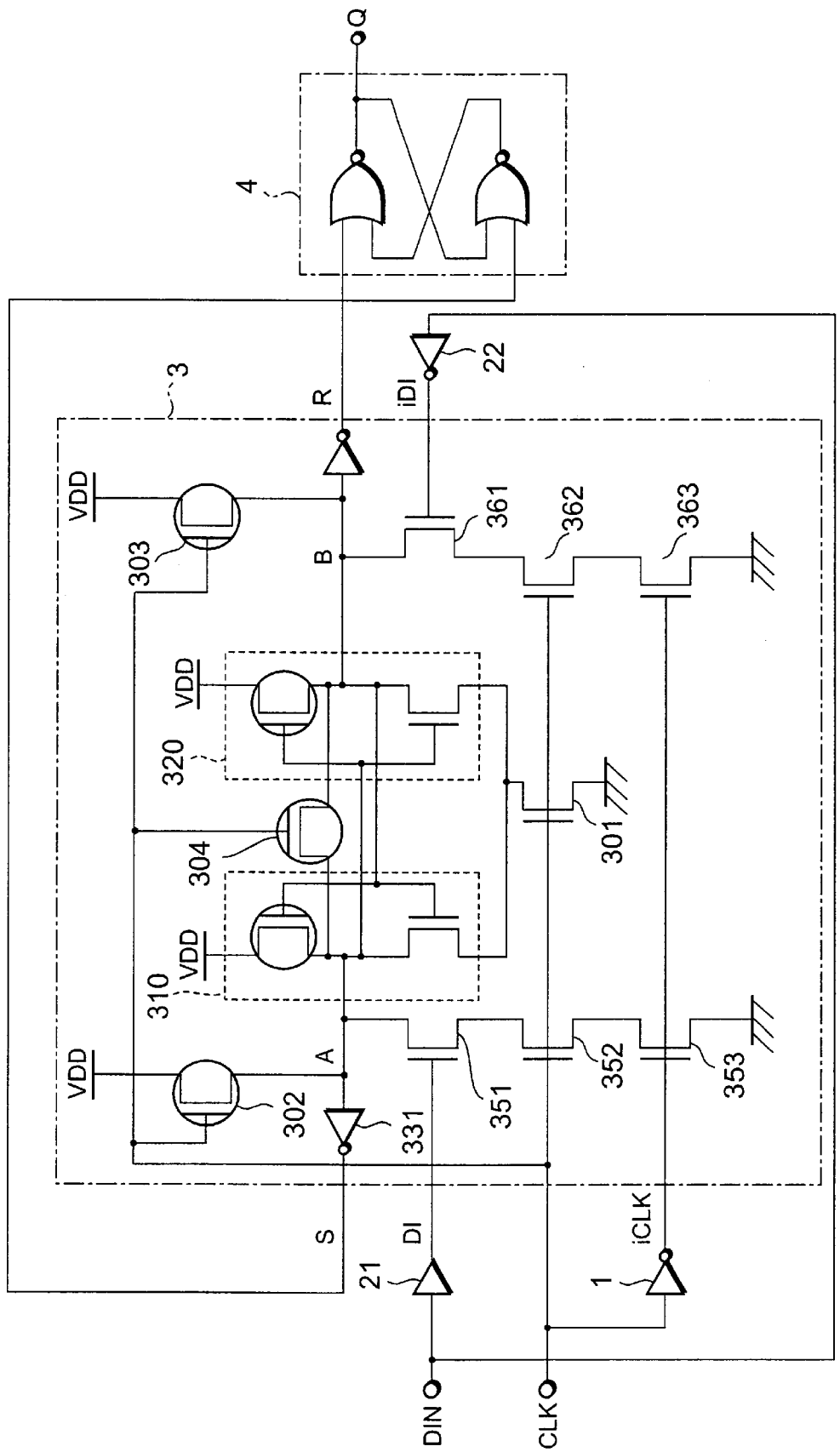
FIG. 1 is a block circuit diagram showing a latch circuit according to the present invention.

The present invention will be described with reference to the drawings, in which FIG. 1 is a block circuit diagram showing a latch circuit of the present invention.

Referring to FIG. 1, the latch circuit according to an embodiment of the present invention comprises an inverter 1, input buffers 21 and 22, a differential amplifier portion 3 and a flip-flop 4.

The inverter 1 has a predetermined delay time (about 0.2 ns) required for inverting a clock signal CLK and outputting an inverted clock signal iCLK. The inverter 1 can be constructed with a single usual CMOS inverter. The delay time is preferably from 0.1 ns to 0.3 ns. The input buffers 21 and 22 receive an input signal DIN and output paired in-phase and opposite-phase differential input signals DI and iDI, respectively.

An N type transistor 301 of the differential amplifier portion 3 receives the clock signal CLK at a gate thereof and is turned on when it is activated, that is, during a second period during which the clock signal is at a high level. Therefore, the inverters 310 and 320 become in operation states when the N type transistor 301 is active. A node A of the differential amplifier portion 3 is connected to an output of the inverter 310 and an input of the inverter 320 and a node B thereof is connected to an input of the inverter 310 and an output of the inverter 320. Therefore, when the inverters 310 and 320 are operated, a potential difference between the nodes A and B is amplified.

The nodes A and B are precharged to a power source voltage VDD by transistors 302, 303 and 304 when the N type transistor 301 is inactive, that is, when the clock signal CLK is in low level.

N type transistors 351, 352 and 353 are connected in series between the node A and a ground and N type transistors 361, 362 and 363 are connected in series between the node B and the ground. The differential input signal pair DI and iDI are supplied to gates of the transistors 351 and 361, respectively.

What is important in this case is the transistors 352, 353, 362 and 363 are on states only during the delay time provided due to a difference in delay between the clock signal CLK and the inverted clock signal iCLK, that is, only when these clock signals are in high level. In the delay time (first period), charge on one of the nodes A and B is pulled out in accurdance with the differential input signals DI and iDI, resulting in a potential difference between the nodes A and B.

The flip-flop 4 is set or reset correspondingly to potentials of the nodes A and B. In this embodiment, the flip-flop 4 is constructed with two 2-input NOR gates. However, the present invention is not limited to such embodiment and the flip-flop can have any other construction so long as it is set or reset by the output signal of the differential amplifier 3.

Further, the differential amplifier portion 3 includes output buffers 331 and 332, that are inputted with the potentials of the nodes A and B, respectively.

P type transistors 302 and 303 have respective gates supplied with the clock signal CLK and are connected between the power source terminal and the nodes A and B, respectively. The P type transistors 302 and 303 precharge the nodes A and B when they are inactivated, respectively. Further, a P type transistor 304 has a gate supplied with the clock signal CLK and is connected between the nodes A and B to equalize the potentials of the nodes A and B when the transistor 304 is inactivated.

Now, an operation of the latch circuit according to this embodiment will be described with reference to FIGS. 1 and 2.

First, when the clock signal CLK is in low level, the P type transistors 302, 303 and 304 are turned on, so that the nodes A and B are precharged to VDD to equalize the potentials thereof. It should be noted at this time that, when the input signal DIN is changed from low level to high level, the in-phase and the opposite phase differential input signals DI and iDI are inverted, respectively, and the N type transistor 351 is turned on, the charge on the precharged nodes A and B is not pulled out since the N type transistors 301, 352 and 362 are turned off. When the nodes A and B are precharged to VDD level, the set signal S and the reset signal R are low level. Therefore, the flip-flop 4 is not triggered and the latch output signal Q is unchanged.

Then, when the clock signal CLK is changed to high level, the P type transistors 302, 303 and 304 are turned off and the precharging and the potential equalization of the nodes A and B are completed.

During the first period, that is, the delay time of the inverted clock signal iCLK, the clock signal CLK and the inverted clock signal iCLK become high level. Therefore, the N type transistors 301, 352, 353, 362 and 363 are turned on and the N type transistors 351 and 361 are turned on and off, respectively. Thus, the charge on the precharged node A is pulled out and the charge on the precharged node B is not, resulting in a potential difference between the nodes A and B.

Since, simultaneously therewith, the inverters 310 and 320 are supplied with the ground potential by the N type transistor 301. Therefore, the potential difference between the nodes A and B is differentially amplified. Further, since the N type transistor 301 is turned on, the inverters 310 and 320 are in operation state even when the inverted clock signal iCLK is changed from high level to low level after the first period and the N type transistors 353 and 363 are turned off. Therefore, the differential amplification of the potential difference between the nodes A and B continues during the second period.

As a result of this differential amplification, only the set signal S among the set signal S and the reset signal R corresponding to the nodes A and B is changed from low level to high level, so that the flip-flop 4 is set and a high level latch output signal Q is outputted.

Then, when the clock signal CLK is changed from high level to low level, the P type transistors 302, 303 and 304 are turned on and the nodes A and B are precharged and equalized. In this case, when the input signal DIN is changed from high level to low level, the in-phase and the opposite phase differential input signals DI and iDI are inverted, respectively, and the N type transistor 361 is turned on, the charge on the precharged nodes A and B is not pulled out since the N type transistors 301, 352 and 362 are turned off. When the nodes A and B are precharged to VDD level, the set signal S and the reset signal R are low level. Therefore, the flip-flop 4 is not triggered and the latch output signal Q is unchanged.

Then, when the clock signal CLK is changed to high level, the P type transistors 302, 303 and 304 are turned off and the precharging and the potential equalization of the nodes A and B are completed.

During the first period, that is, the delay time of the inverted clock signal iCLK, the clock signal CLK and the inverted clock signal iCLK become high level. Therefore, the N type transistors 301, 352, 353, 362 and 363 are turned on and the N type transistors 351 and 361 are turned on and off, respectively. Thus, the charge on the precharged node A is not pulled out and the charge on the precharged node B is pulled out, resulting in a potential difference between the nodes A and B.

Simultaneously therewith, the inverters 310 and 320 are supplied with the ground potential by the N type transistor 301. Therefore, the potential difference between the nodes A and B is further differentially amplified.

As a result of this differential amplification, only the reset signal R among the set signal S and the reset signal R corresponding to the nodes A and B is changed from low level to high level, so that the flip-flop 4 is reset and a low level latch output signal Q is outputted.

Figure 2:
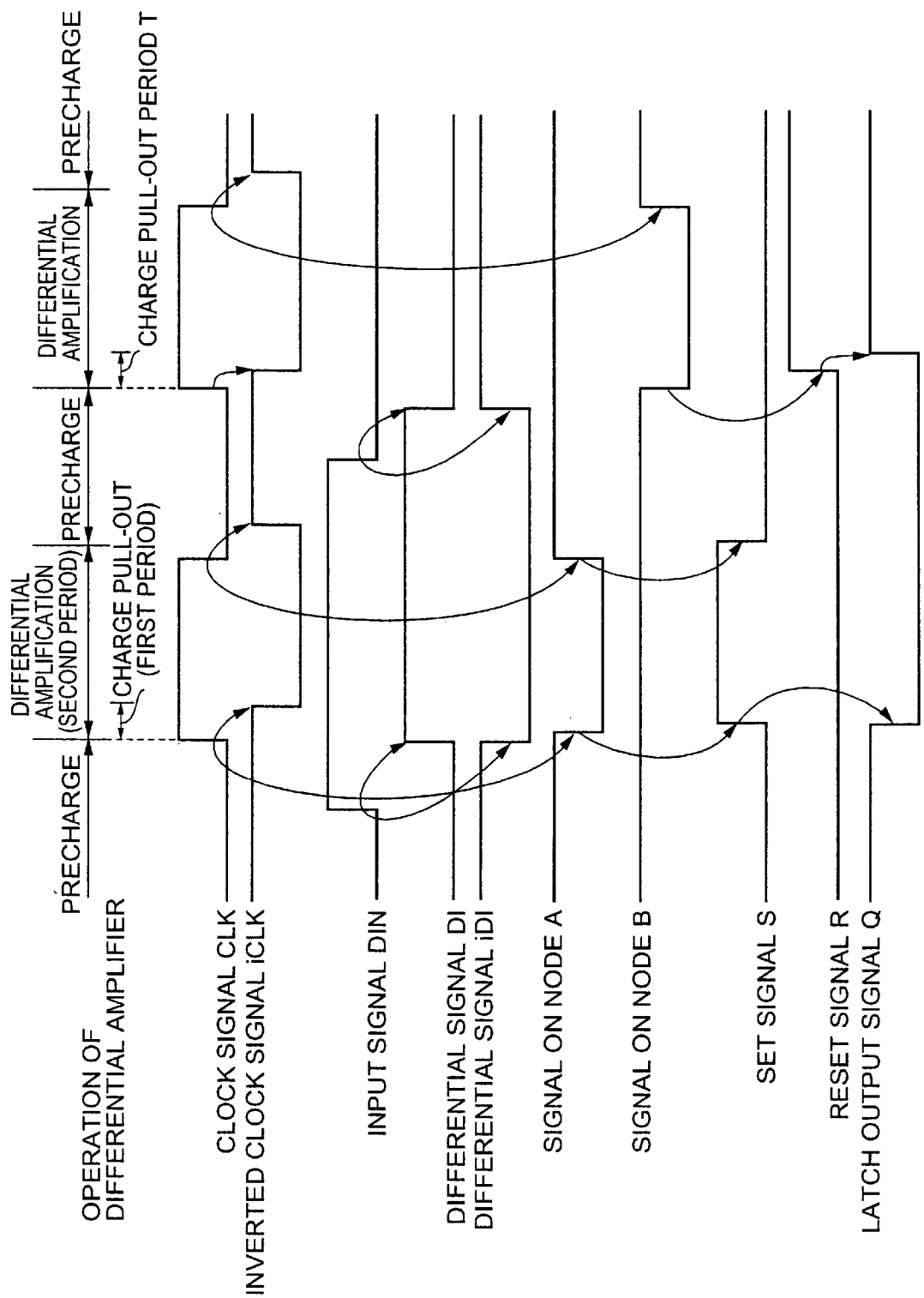
FIG. 2 shows waveforms for explaining an operation of the latch circuit shown in FIG. 1.
Figure 3:
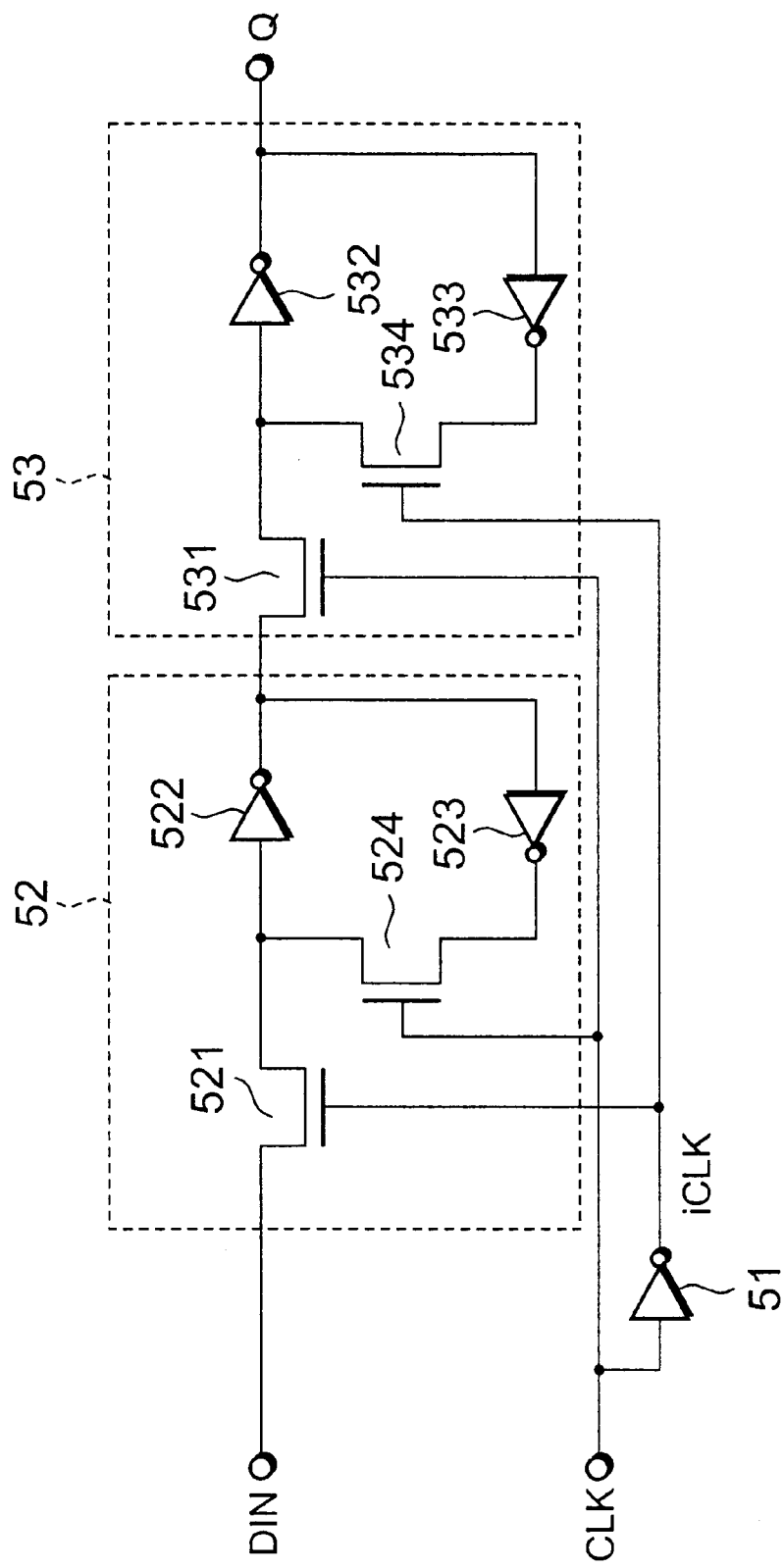
FIG. 3 is a block circuit diagram showing a conventional latch circuit.

As mentioned above, the latch circuit latches the input signal DIN during a period from a rising edge of the clock signal CLK to a next rising edge thereof as shown by a waveform of the latch output signal Q in FIG. 2.

In the latch circuit according to this embodiment, time instances of the rising edges of the clock signal CLK correspond to the time instances at which the held data corresponding to the potential difference between the in-phase differential input signal DI and the opposite phase differential input signal iDI, that is, the level of the input signal DIN is confirmed. Therefore, the setup time or the hold time of the input signal DIN with respect to the rising edge of the clock signal CLK becomes substantially shorter compared with the conventional latch circuit and close to zero value, so that the timing design of the integrated circuit is facilitated.

Further, in the case of the SDRAM or DDR-SDRAM, which is to be operated at high speed, a number of sense circuits are used. Each such sense circuit performs a differential amplification similarly to the differential amplifier portion of the latch circuit of the present invention and has a similar timing characteristics to that of the differential amplifier portion, for a power source voltage or temperature. Therefore, when a plurality of the present latch circuits are used in the SDRAM or DDR-SDRAM, the same timing design can be applied to the plurality of sense circuits and the latch circuits, causing the timing design of the SDRAM or DDR-SDRAM to be facilitated.

Although the circuit for latching the input signal at the rising edge of the clock signal has been described as an example, it is possible when the SDRAM, etc., is used, to construct a circuit for latching the input signal at a falling edge of the clock signal. Further, by connecting these circuits in parallel, it is also possible to construct a circuit for latching the input signal at both the rising edge and the falling edge of the clock signal.

Although the present invention has been described with reference to specific embodiments, this description is not meant to be construed in a limiting sense. Various modifications of the described embodiments will become apparent to persons skilled in the art upon reference to the description of the invention. It is, therefore, contemplated that the appended claims will cover any modifications or embodiments as fall within the true scope of the invention.

What is claimed is:

1. A latch circuit comprising:

a delaying inverter circuit for inverting a clock signal with a predetermined delay;

a precharging circuit for precharging first and second nodes of said latch circuit to a predetermined potential during a time period in which the clock signal is at a first logic level;

a first amplifier circuit for providing a potential difference between said first and second nodes in response to an input signal during a first time period in which the clock signal and an output signal of said delaying inverter circuit are at a second logic level, wherein said first amplifier means comprises a first transistor group and a second transistor group for pulling out one of charges of said first and second nodes during the first time period;

second amplifier circuit for amplifying the potential difference between said first node and said second node during a second time period; and a flip-flop circuit adapted to be set and reset according to the potentials at the first and second nodes, wherein said first amplifier circuit comprises:

a first transistor group including a first transistor having a gate supplied with the input signal, a second transistor having a gate supplied with the clock signal and a third transistor having a gate supplied with an output of said delaying inverter circuit, said first, second and third transistors being connected in series between said first node and a power source; and a second transistor group including a fourth transistor having a gate supplied with an inverted signal of the input signal, a fifth transistor having a gate supplied with the clock signal and a sixth transistor having a gate supplied with the output signal of said delaying inverter circuit, said fourth, fifth and sixth transistors being connected in series between said second node and said power source.

2. A latch circuit as claimed in claim 1, wherein said second amplifier circuit comprises:

a first inverter circuit having an input terminal connected to said second node and an output terminal connected to said first node;

a second inverter circuit having an input terminal connected to said first node and an output terminal connected to said second node; and a power supply circuit for supplying a power supply voltage during a time period in which the clock signal is at the second logic level.

* * * * *